(12) United States Patent
Zhou et al.

(10) Patent No.: US 11,056,659 B2
(45) Date of Patent: Jul. 6, 2021

(54) DISPLAY PANELS AND DISPLAY DEVICES

(71) Applicant: Kunshan Go-Visionox Opto-Electronics Co., Ltd., Kunshan (CN)

(72) Inventors: Zhiwei Zhou, Kunshan (CN); Xiuqi Huang, Kunshan (CN); Zhenzhen Han, Kunshan (CN); Yanqin Song, Kunshan (CN); Weilong Li, Kunshan (CN); Siming Hu, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 47 days.

(21) Appl. No.: 16/425,971

(22) Filed: May 30, 2019

(65) Prior Publication Data

US 2019/0280227 A1 Sep. 12, 2019

Related U.S. Application Data

(63) Continuation of application No. PCT/CN2018/110690, filed on Oct. 17, 2018.

(30) Foreign Application Priority Data

May 14, 2018 (CN) .......................... 201810456226.0

(51) Int. Cl.
*G09G 3/3258* (2016.01)
*H01L 51/00* (2006.01)
*H01L 27/32* (2006.01)

(52) U.S. Cl.
CPC ....... *H01L 51/0097* (2013.01); *G09G 3/3258* (2013.01); *H01L 27/3276* (2013.01); *G09G 2300/0426* (2013.01)

(58) Field of Classification Search
CPC .......... G09G 3/32; G09G 3/3258; G09G 3/36; H01L 51/0097; H01L 27/3276
See application file for complete search history.

(56) References Cited

U.S. PATENT DOCUMENTS

2006/0038762 A1* 2/2006 Chou ..................... G09G 3/325
345/92
2010/0026611 A1* 2/2010 Igeta ................. G02F 1/136286
345/55

(Continued)

FOREIGN PATENT DOCUMENTS

| CN | 107481669 A | 12/2017 |
| CN | 107658332 A | 2/2018 |

(Continued)

OTHER PUBLICATIONS

CN First Office Action dated Feb. 28, 2019 in the corresponding CN application(application No. 201810456226.0).

*Primary Examiner* — Alexander Eisen
*Assistant Examiner* — Cory A Almeida
(74) *Attorney, Agent, or Firm* — Kilpatrick Townsend & Stockton

(57) ABSTRACT

Exemplary embodiments of the present disclosure relate to display panels and display devices. The display panel includes: a base substrate; a display screen body disposed on the base substrate and including a display surface and a back surface, the display screen body being provided with a groove penetrating the display surface and the back surface, and an area of the display surface of the display screen body other than an area of the groove being a display area, a number of data signal wires configured to transmit driving data for pixel units in the display area; a number of power supply wires configured to supply an operating voltage to (Continued)

the pixel units in the display area and connected to a common power bus that surrounds the groove.

18 Claims, 5 Drawing Sheets

(56) References Cited

U.S. PATENT DOCUMENTS

2018/0156964 A1* 6/2018 Song ................ G02F 1/133308
2018/0158417 A1  6/2018 Xiang et al.
2019/0123115 A1  4/2019 Sun et al.

FOREIGN PATENT DOCUMENTS

| CN | 107731886 A | 2/2018 |
| CN | 107783334 A | 3/2018 |
| CN | 108648627 A | 10/2018 |

* cited by examiner

DISPLAY PANELS AND DISPLAY DEVICES

CROSS-REFERENCES TO RELATED APPLICATIONS

This application is a continuation application of International Application No. PCT/CN2018/110690, filed on Oct. 17, 2018, which claims the priority benefit of Chinese Patent Application No. 201810456226.0, titled "DISPLAY PANELS AND DISPLAY DEVICES" and filed on May 14, 2018. The entireties of both applications are incorporated by reference herein for all purposes.

FIELD

Exemplary embodiments of the present disclosure relate to display technologies, and more particularly relate to display panels and display device.

BACKGROUND

At present, a flexible display device generally employs an organic light-emitting diode (OLED) device that is easy to realize flexibility. A flexible OLED device is widely used in a smart terminal product such as a mobile phone and a tablet. As the flexible OLED device is easy to customize in appearance, more and more terminal manufacturers apply it to a full-screen and non-frame product. Since the full-screen and non-frame product requires a larger light-emitting area, in practical applications, it is usually necessary to provide a mounting hole on the flexible organic light-emitting display to reserve a mounting position on a terminal device for a hardware such as a front camera, an earpiece, and a start key. The mounting hole is generally provided in a non-display area outside an effective display area in the prior art, which limits an area of the effective display area, resulting in an inability to manufacture a full screen.

SUMMARY

Accordingly, display panels and display devices are provided in exemplary embodiments of the present disclosure, which can improve a screen ratio and enable display panels to realize a narrow frame display effect.

A display panel includes:

a base substrate;

a display screen body disposed on the base substrate and including a display surface and a back surface; the display screen body being provided with a groove; an area of the display surface of the display screen body other than an area of the groove being a display area;

a plurality of data signal wires configured to transmit driving data for pixel units in the display area; wherein for pixel unit columns truncated by the groove in a first direction, the data signal wire corresponding to each pixel unit column, when extending linearly in the first direction from a data signal output terminal to the groove, resumes straight line extension after extending around an edge of the groove until reaching a position of the same pixel unit column on the other side of the groove; and a plurality of power supply wires configured to supply an operating voltage to the pixel units in the display area; wherein for the pixel unit columns truncated by the groove in the first direction, the power supply wire corresponding to each pixel unit column, when extending linearly in the first direction to the groove, is connected to a common power bus that surrounds the groove.

According to the aforementioned display panel, the groove for receiving various types of sensing elements is directly provided in the display screen body, which solves the problem that the mounting position of various types of sensing elements provided outside the display screen body reduce the screen ratio of the display device. Further, a common power (VDD) bus surrounding the groove is further provided in the display area of the display screen body, and the common power bus is used to collect power supply wires in the display panel passing through the periphery of the groove, thereby enabling the power supply wires at the periphery of the groove to be directly connected to the common power bus without bypassing the groove, thereby realizing a narrow frame display effect at the periphery of the groove.

In an embodiment, a cross-sectional area of a portion of the data signal wire extending around the edge of the groove is larger than a cross-sectional area of a portion of the data signal wire extending linearly.

In an embodiment, the display panel further includes a peripheral circuit including at least one of a scan-driving circuit and a reference signal circuit.

In an embodiment, the scan-driving circuit includes a plurality of scan-driving traces extending along a second direction within the display area configured to transmit scanning data for the pixel units in the display area; wherein, for pixel unit columns truncated by the groove in the second direction, the scan-driving trace corresponding to each pixel unit column, when extending linearly in the second direction from a scanning signal output terminal to the groove, resumes straight line extension after extending around an edge of the groove until reaching a position of the same pixel unit column on the other side of the groove; for pixel unit columns without being truncated by the groove in the second direction, the scan-driving trace corresponding to each pixel unit column extends linearly in the second direction.

In an embodiment, when extending to the groove, each scan-driving trace diverges to form at least two branches, and the branches of the scan-driving trace wrap around the edge of the groove to enclose the groove.

In an embodiment, a cross-sectional area of a portion of the scan-driving trace extending around the edge of the groove is larger than a cross-sectional area of a portion of the scan-driving trace extending linearly.

In an embodiment, the reference signal circuit includes a plurality of reference signal traces extending along the first direction within the display area, and the plurality of reference signal traces are broken when passing through the groove.

In an embodiment, the display area includes a first region and a second region, and the second region is disposed surrounding the edge of the groove and provided with no pixel unit;

wherein, portions of the plurality of data signal wires and the plurality of power supply wires extending linearly are disposed in the first region; and portions of the common power bus, the plurality of data signal wires, the plurality of power supply wires, and the plurality of scan-driving traces extending around the edge of the groove are disposed in the second region.

In an embodiment, the display screen body is provided with at least one groove.

In an embodiment, the display panel further includes a first metal layer, a second metal layer, and a third metal layer disposed on the base substrate and laminated with each other, and an insulating material being filled between the first metal layer and the second metal layer and filled between the second metal layer and the third metal layer.

In an embodiment, the plurality of power supply wires are disposed on the first metal layer, the common power bus is disposed on the second metal layer, and the plurality of power supply wires are connected to the common power bus via through hole.

In an embodiment, the plurality of scanning-driving traces are disposed on the second metal layer, and the plurality of data signal wires are disposed on the third metal layer.

In an embodiment, a distance between the first metal layer and the second metal layer is less than a distance between the second metal layer and the third metal layer, a compensating capacitance formed by the plurality of power supply wires and the plurality of scan-driving traces is greater than a compensating capacitance formed by the plurality of scan-driving traces and the plurality of data signal wires.

In an embodiment, an area ratio of the groove to the display area is 6:10000 to 18:10000.

In an embodiment, the base substrate is a glass substrate or a substrate of flexible material.

In an embodiment, a reference signal circuit bus of the reference signal circuit is disposed at an upper bottom portion and/or a lower bottom portion of the base substrate, and power is collectively supplied to the plurality of reference voltage traces through the reference signal circuit bus.

In an embodiment, the groove penetrates the display surface and the back surface of the display panel to form a groove on the base substrate.

A display device includes:

a display panel according to any one of the above embodiments; and a sensing element disposed in the groove of the display panel.

DETAILED DESCRIPTION OF THE INVENTION

In order to make the above objects, features and advantages of the present disclosure more apparent, specific embodiments of the present disclosure will be described in detail with reference to the accompanying drawings. Numerous specific details are set forth in the description below in order to provide a thorough understanding of the disclosure. However, the present disclosure can be implemented in many other ways than those described herein, and those skilled in the art can make similar modifications without departing from the scope of the present disclosure, and thus the present disclosure is not limited by the specific embodiments disclosed below.

Figure 1:
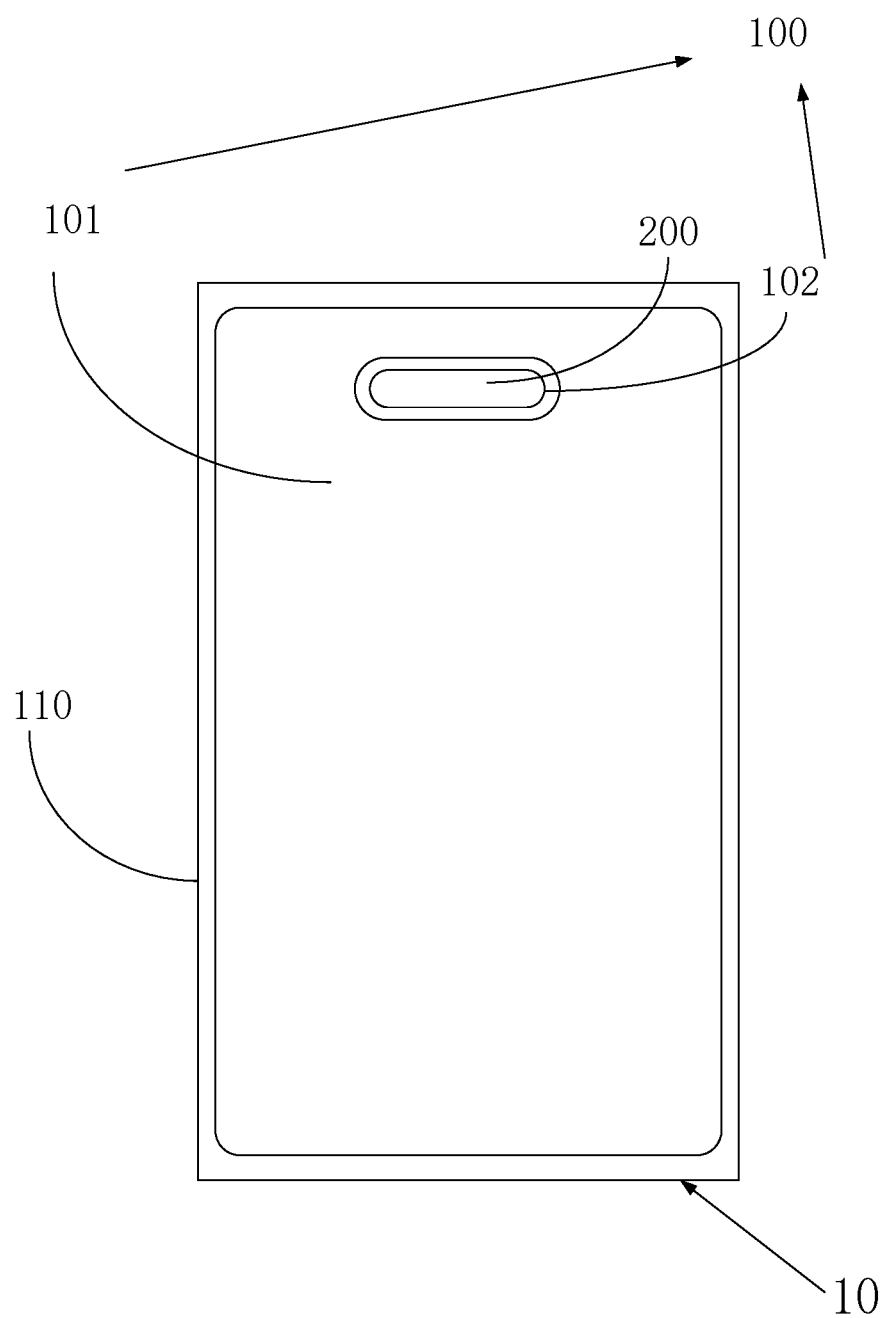
FIG. 1 is a plan view of a display panel in accordance with an embodiment of the present disclosure.
Figure 2:
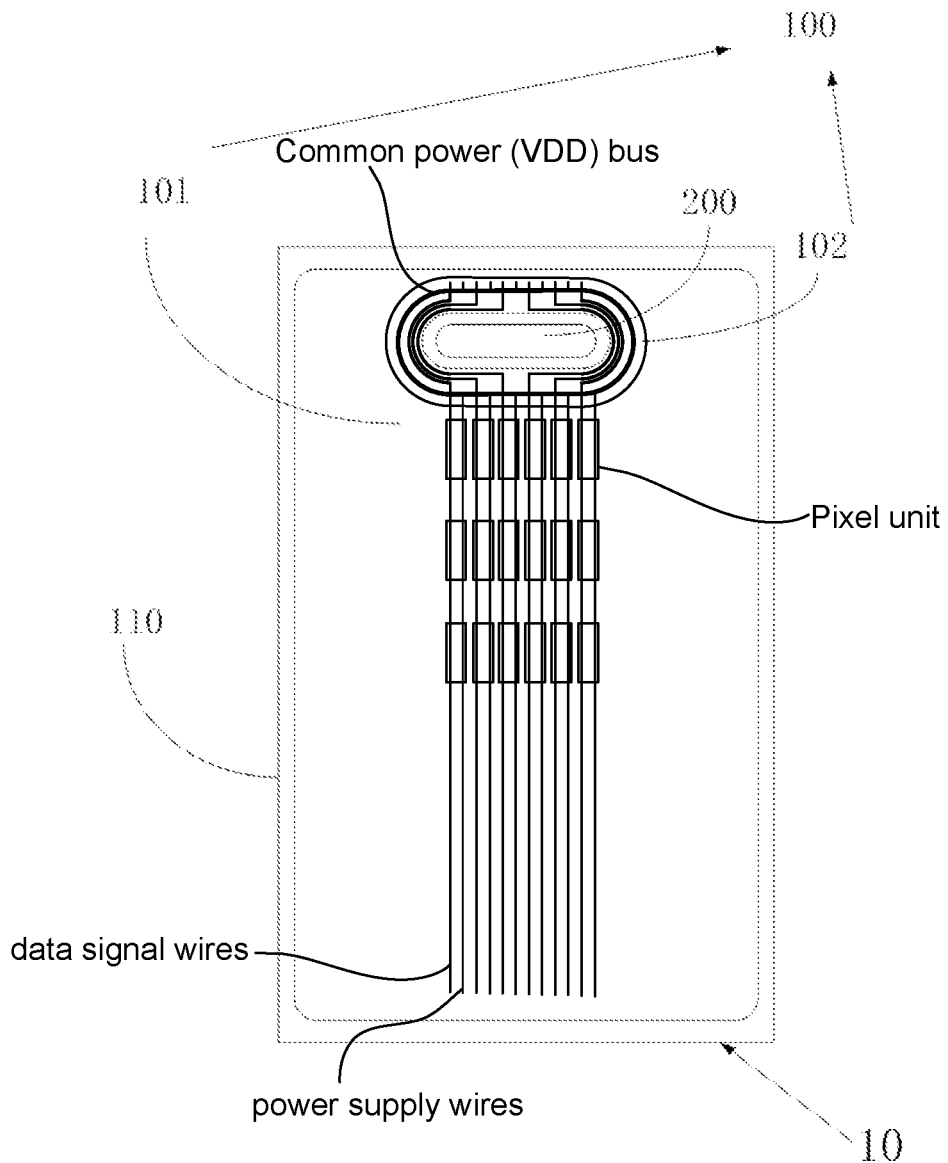
FIG. 2 is a plan view of a display panel in accordance with an embodiment of the present disclosure.
Figure 3:
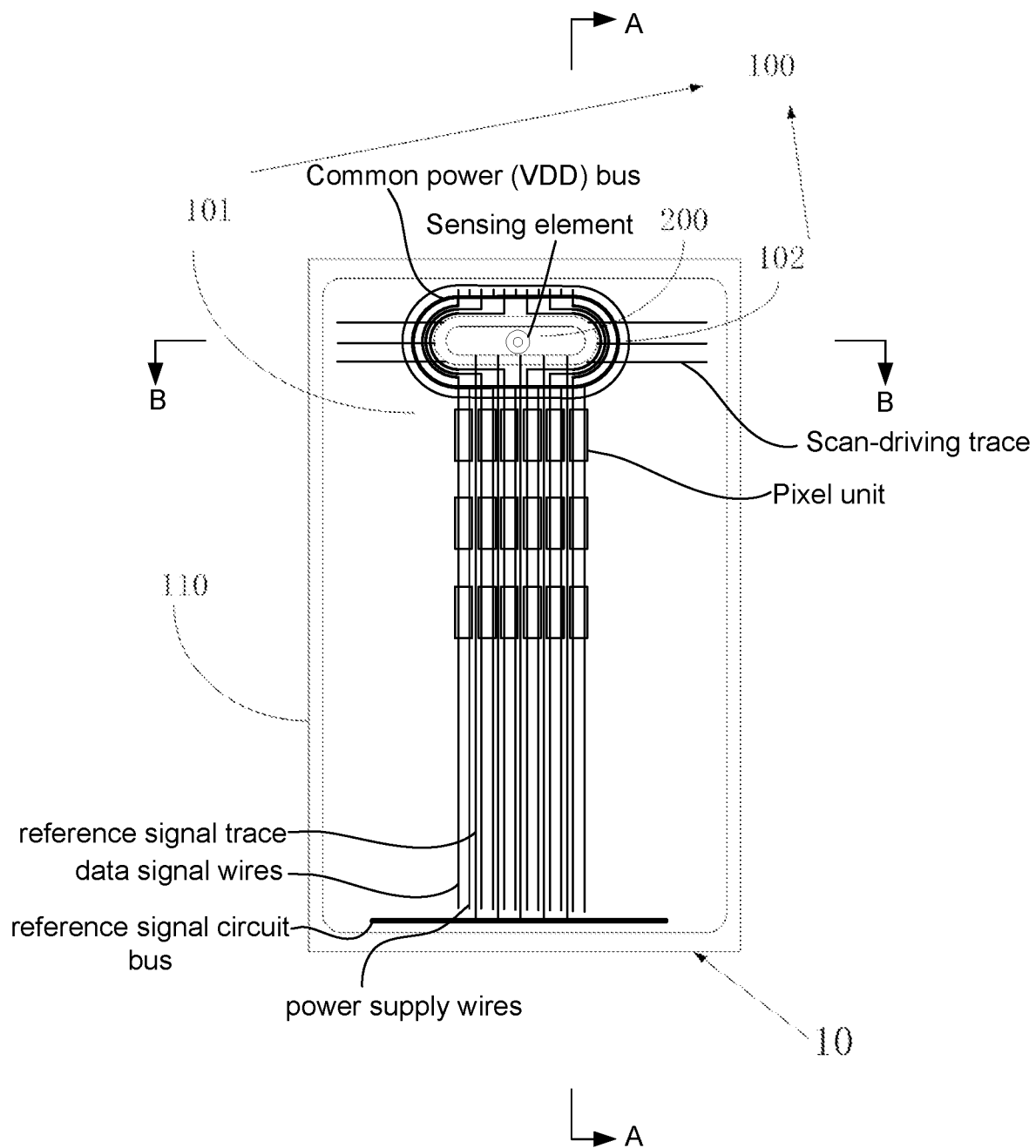
FIG. 3 is a plan view of a display panel in accordance with an embodiment of the present disclosure.

Referring to FIG. 1, a display panel 10 is provided in exemplary embodiments of the present disclosure, which includes: a base substrate 110; a display screen body disposed on the base substrate 110, which includes a display surface and a back surface, where the display screen body is provided with a groove 200, an area of the display surface of the display screen body other than an area of the groove 200 is a display area 100. Referring to FIG. 2 and FIG. 3, display panel 10 may further include a plurality of data signal wires used to transmit driving data to pixel units in the display area 100, where for pixel unit columns truncated by the groove 200 in a first direction, the data signal wire corresponding to each pixel unit column, when extending linearly in the first direction from a data signal output terminal to the groove 200, resumes straight line extension after extending around an edge of the groove 200 until reaching a position of the same pixel unit column on the other side of the groove 200, and for pixel unit columns without being truncated by the groove 200 in the first direction, the data signal wire corresponding to each pixel unit column extends linearly in the first direction; and a plurality of power supply wires used to supply an operating voltage to the pixel units in the display area 100, where for the pixel unit columns truncated by the groove in the first direction, the power supply wire corresponding to each pixel unit column, when extending linearly in the first direction to the groove 200, is connected to a common power bus that surrounds the groove 200, and at the same pixel unit column on the other side of the groove 200, the power supply wire extends linearly and is connected the common power bus.

It can be understood that the groove 200 can be a through groove extending from the display surface to the back surface, or can be a non-through groove, as long as a component such as a front camera, an earpiece, and a start key can be placed in the groove, which all belong to the groove protected in exemplary embodiments of the present disclosure. For example, when the groove 200 is a through groove, a space where the components can be placed will be larger and more suitable for the narrow frame of the display device.

It can be understood that the first direction is an arrangement direction of the pixel units of the display area, and can be, for example, a horizontal direction or a vertical direction of the display area.

According to the aforementioned display panel 10, the groove 200 for receiving various types of sensing elements is directly provided in the display screen body, which solves the problem that the mounting position of various types of sensing elements provided outside the display panel 10 reduce the screen ratio of the display device. Since there is no need to provide the groove for receiving various types of sensing elements outside the display screen body, a narrow frame display effect of the display panel is achieved. Further, a common power (VDD) bus surrounding the groove 200 is further provided in the display area 100 of the display screen body. The common power bus is used to collect power supply wires in the display panel 10 passing through the periphery of the groove 200, thereby enabling the power supply wires at the periphery of the groove 200 to be directly connected to the common power bus without bypassing the groove 200, thereby realizing the narrow frame display effect at the periphery of the groove 200.

In an embodiment, the base substrate 110 can be a glass substrate or a substrate of flexible material. A primary function of the base substrate 110 is to provide support for other components on the display panel 10. The display panel 10 made by using a glass substrate or a substrate of flexible material as a substrate is a liquid crystal display panel 10 or a flexible display panel 10.

In an embodiment, the display panel includes a display surface and a back surface, and an area of the display surface other than an area of the groove 200 is the display area 100. It can be understood that the display surface of the display screen body can perform a display function, and the back surface thereof is used to dispose a pixel driving circuit for driving display units.

In an embodiment, the display area 100 is composed of a plurality of display units. The display unit can be an OLED device or a light-emitting diode (LED) device. Taking that the display unit is an OLED device as an example, each display unit can include an organic functional layer and an anode and a cathode respectively disposed on both sides of the organic functional layer.

In an embodiment, the display area 100 is provided with a first region 101 and a second region 102. The second region 102 is provided with no pixel and does not perform a display function. As shown in FIG. 1, the second region 102 is circumferentially disposed around the periphery of the groove 200 to form an annular region.

Further, portions of the plurality of data signal wires and the plurality of power supply wires extending linearly are disposed in the first region 101; portions of the common power bus and the plurality of data signal wires, the plurality of power supply wires, and the plurality of scan-driving traces extending around an edge of the groove 200 are all disposed in the second region 102.

In an embodiment, the groove 200 penetrates the display surface and the back surface of the display panel to form a groove on the base substrate 110 for disposing various types of sensing elements such as a camera, a photoelectric sensor, an earpiece, etc.

Further, the shape of the groove 200 can be an elongated shape or other shapes as long as various types of sensing elements can be placed therein. It can be understood that an area of the groove 200 is smaller than the display area 100 for display.

Specifically, an area ratio of the groove 200 to the display area 100 is 6:10000 to 18:10000.

Figure 4:
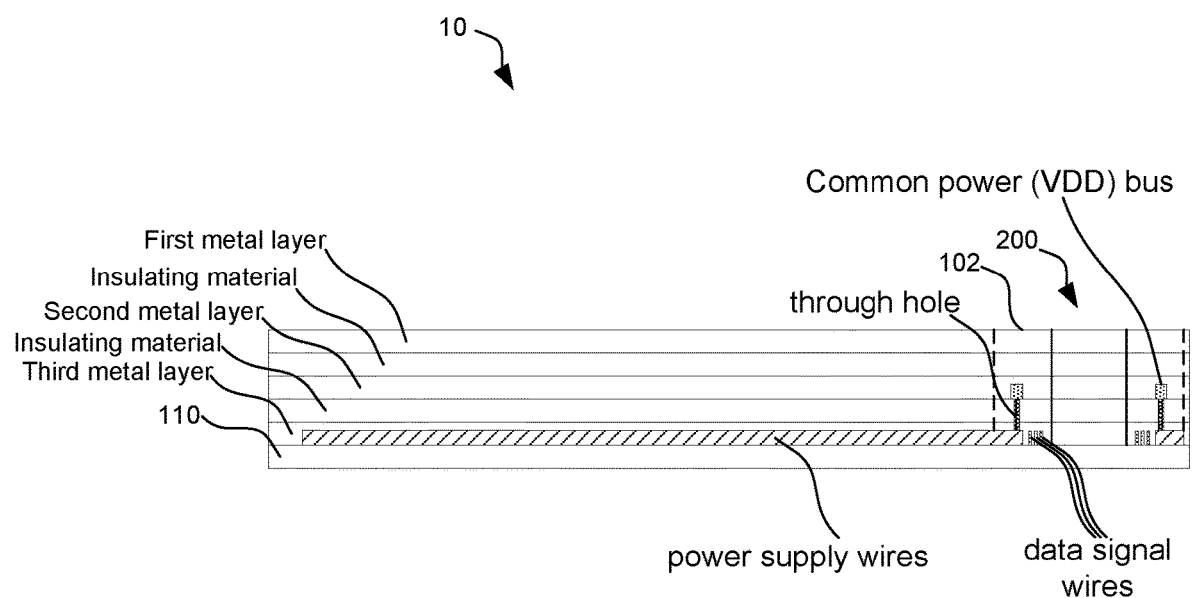
FIG. 4 is a cross-section view of a display panel in accordance with an embodiment of the present disclosure, showing the first metal layer, the second metal layer, and the third metal layer.

In an embodiment, the display panel 10 further includes a first metal layer, a second metal layer, and a third metal layer disposed on the base substrate 110, as shown in FIG. 4. FIG. 4 is a cross-section view of display panel 10 taken along the cross-section indicated by arrows A-A in FIG. 3. The first metal layer, the second metal layer, and the third metal layer are stacked. An insulating material such as silicon oxide is filled between the metal layers. The common power (VDD) bus in the second region 102 is disposed on the second metal layer, the other power supply wires in the display panel 10 are disposed on the first metal layer, and the data signal wires are disposed on the third metal layer.

Further, the power supply wires in the second region 102 is connected to the common power (VDD) bus via a through hole. It can be understood that, in this way, the power supply wires in the second region 102 is connected to the common power (VDD) bus via the second metal layer, and can reserve a receiving space for the data signal wires in the second region 102.

In an embodiment, a cross-sectional area of a portion of the data signal wire extending around an edge of the groove 200 is larger than a cross-sectional area of a portion of the data signal wire extending linearly. It can be understood that the data signal wire in the second region 102 is required to bypass the groove 200, which causes a total length of the data signal wire to be too long, thereby causing a resistance thereof to be large. The data signal wire and the power supply wire in the second region 102 are respectively located on different metal layers of the display panel 10. Thus, the data signal wires in the second region 102 have sufficient space to thicken the cross-sectional area thereof, that is, to thicken the data signal wire in the second region 102 so as to reduce the resistance of the power supply trace, thereby reducing an IR drop.

In an embodiment, the display panel 10 further includes a peripheral circuit. The peripheral circuit includes at least one of a scan-driving circuit and a reference signal circuit.

In an embodiment, the scan-driving circuit includes a plurality of scan-driving traces extending along a second direction within the display area 100 for transmitting scanning data for pixel units in the display area 100. The second direction is another arrangement direction of the pixel units of the display area, and the second direction intersects with the first direction. For example, the first direction is the horizontal direction of the display area, and the second direction is the vertical direction of the display area, or the first direction is the vertical direction of the display area and the second direction is the horizontal direction of the display area. For pixel unit columns truncated by the groove 200 in the second direction, the scan-driving trace corresponding to each pixel unit column, when extending linearly in the second direction from a scanning signal output terminal to the groove 200, resumes straight line extension after extending around an edge of the groove 200 until reaching a position of the same pixel unit column on the other side of the groove 200, and for pixel unit column without being truncated by the groove 200 in the second direction, the scan-driving trace corresponding to each pixel unit column extends linearly in the second direction.

Further, the scan-driving circuit includes a SCAN signal scanning circuit and an EM signal scanning circuit. Both circuits include a plurality of scan-driving traces. The plurality of scan-driving traces are disposed along the second direction on the back surface of the display screen body. It can be understood that the plurality of scan-driving traces are also disposed bypassing the groove 200, and portions of the plurality of scan-driving traces bypassing the groove 200 are disposed in the second region 102.

Further, each scan-driving trace can be branched to form upper and lower branches when extending to the groove 200. Since the scan-driving traces are disposed in the display area 100 along the second direction, the branched two branches can be arranged along upper and lower edges of the groove 200 to enclose the groove 200.

Figure 5:
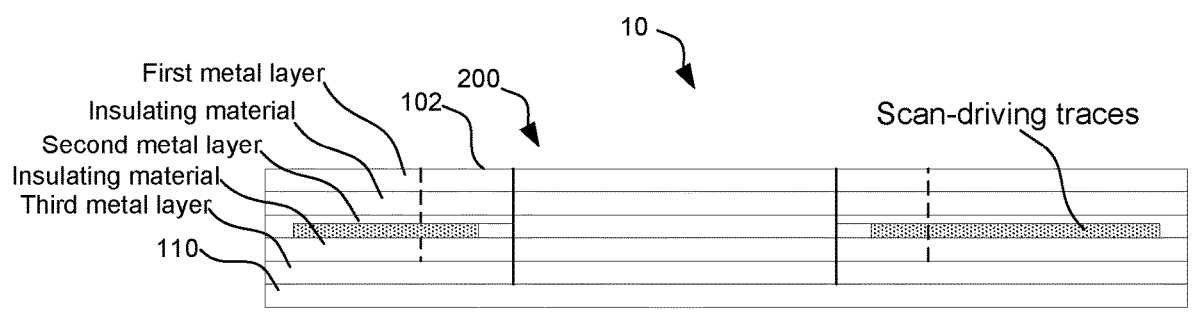
FIG. 5 is a cross-section view of a display panel in accordance with an embodiment of the present disclosure, showing the first metal layer, the second metal layer, and the third metal layer.

In an embodiment, since the plurality of scan-driving traces are disposed on the back surface of the display screen body along the second direction and the plurality of data signal wires are disposed on the back surface of the display screen body along the first direction, the plurality of scan-driving traces and the plurality of data signal wires bypass the groove 200 in the display area 100 and are partially disposed in the second region 102. Since wiring directions thereof are different, a plurality of data signal wires and a plurality of scan-driving traces overlap with each other in the second region 102. Further, the plurality of scan-driving wires are provided on the second metal layer of the display panel 10, and the data signal wires are provided on the third metal layer of the display panel 10, and an insulating material is filled between the second metal layer and the third metal layer, as shown in FIG. 5, therefore, the plurality of scan-driving wires and the data signal wires form a compensating capacitance, so that uniformity of luminance of the organic light-emitting display panel 10 can be improved, and image display effect of the display device can be improved. FIG. 5 is a cross-section view of display panel 10 taken along the cross-section indicated by arrows B-B in FIG. 3.

Further, since each of the plurality of scan-driving traces is respectively branched into two branches at the groove 200, an overlapping area of the scan-driving traces and the data signal wires in the second region 102 is increased, and stability of circuit voltage is increased.

In an embodiment, the plurality of power supply wires overlap with the plurality of scan-driving traces, and the plurality of power supply wires and the plurality of scan-driving traces are respectively disposed on the first metal layer and the second metal layer. Since a distance from the first metal layer to the second metal layer is shorter, the power supply wires and the plurality of scan-driving traces also have a compensation capacitor which is larger than the compensating capacitance generated by the scan-driving traces and the data signal wires.

In an embodiment, the reference signal circuit is a voltage reference (VREF) circuit. The VREF circuit includes a plurality of VREF traces disposed on the back surface of the display screen body along the first direction. Since the reference signal circuit bus is disposed on the upper bottom and/or the lower bottom of the base substrate 110, the plurality of VREF traces can be concentratedly supplied via the reference signal circuit bus, so that the VREF traces passing through the groove 200 is not required to bypass the groove 200, but can be disconnected directly at the groove 200. In this way, a narrow frame display effect around the periphery of the groove 200 can be achieved.

In an embodiment, since the second region 102 is provided with no pixel, various traces disposed in the second region 102 all require a bypass arrangement, a length of the traces is prolonged than that of original wiring traces. Therefore, the cross-sectional areas of the plurality of power supply wires and the plurality of scan-driving traces disposed in the second region 102 can be appropriately adjusted to reduce the resistance thereof. It can be understood that widening the cross-sectional areas of the plurality of power supply wires and the plurality of scan-driving traces disposed in the second region 102 can reduce the resistance thereof and reduce the voltage drop (IR Drop), thereby improving display uniformity of the display panel 10.

In an embodiment, the display panel 10 includes at least one groove 200. The groove 200 is provided for receiving various types of sensing elements such as a distance sensing element, an optical sensing element, etc. specifically, for receiving a image device, an earpiece, etc. The functional diversity of the display device can be achieved by the provision of a plurality of grooves 200.

It can be understood that each groove 200 requires a corresponding wiring area and a wiring manner to achieve corresponding circuit compensation.

As can be seen from the above, according to the display panel 10 provided in the present disclosure, the groove for receiving sensing element is directly disposed in the display screen body, which solves the problem that the mounting position for various types of sensing elements provided outside the display panel 10 reduce the screen ratio of the display device. Also provided within the display area 100 is a second area 102 for receiving portions of the plurality of data signal wires, the plurality of power supply wires, the plurality of scan-driving traces and the common power bus that extend around the edge of the groove. The common power (VDD) bus is provided such that the power supply wires at the periphery of the groove 200 can be directly connected to the common power (VDD) bus without bypassing the groove 200, so as to achieve a narrow frame display effect at the periphery of the groove 200. Meanwhile, capacitive load can be compensated by the overlap between two of the scan-driving traces, the data signal wires, and the power supply wires, thereby eliminating a problem of display unevenness caused by the provision of the groove. Since the scan-driving trace branches into the upper and lower branches at the groove 200, an overlapping area of projections of the scan-driving traces and the data signal wires in the second region is increased, a capacitance compensation structure is optimized and an amount of capacitance compensation per unit area is increased.

A display device is further provided in the present disclosure, which includes the display panel 10 in the afore-described embodiments, and a sensing element disposed in the display panel 10.

In an embodiment, the sensing element includes one or more of a distance sensing element, a camera, an earpiece, and a start key, and can be other sensing elements. The sensing element can be determined according to configuration requirements of the display device.

Specifically, the display device can be any product or component having a display function such as an electronic paper, a mobile phone, a tablet, a television, a display, a notebook, a digital photo frame, a navigator, a car display, an AR/VR device, a smart watch, and the like.

Since the display panel 10 described in the forgoing embodiments of the present disclosure is used in the display device provided by the present disclosure, the advantageous effects thereof are the same as those of the above-described display panel 10, and will not be described in detail herein.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A display panel, comprising:
   a base substrate;
   a display screen body disposed on the base substrate and comprising a display surface and a back surface; the display screen body being provided with a groove; an area of the display surface of the display screen body other than an area of the groove being a display area;
   a plurality of data signal wires configured to transmit driving data for pixel units in the display area; wherein for pixel unit columns truncated by the groove in a first direction, the data signal wire corresponding to each pixel unit column, when extending linearly in the first direction from a data signal output terminal to the groove, resumes straight line extension after extending around an edge of the groove until reaching a position of the same pixel unit column on the other side of the groove; and a plurality of power supply wires configured to supply an operating voltage to the pixel units in the display area; wherein for the pixel unit columns truncated by the groove in the first direction, the power supply wire corresponding to each pixel unit column, when extending linearly in the first direction to the groove, is connected to a common power bus that surrounds the groove, wherein a cross-sectional area of a portion of the data signal wire extending around the edge of the groove is larger than a cross-sectional area of a portion of the data signal wire extending linearly, further comprising a first metal layer, a second metal layer, and a third metal layer disposed on the base substrate and laminated with each other, and an insulating material being filled between the first metal layer and the second metal layer and filled between the second metal layer and the third metal layer, wherein the plurality of power supply wires are disposed on the first metal layer, the common power bus is disposed on the second metal layer, and the plurality of power supply wires are connected to the common power bus via through hole, wherein the plurality of scanning signal traces are disposed on the second metal layer, and the plurality of data signal wires are disposed on the third metal layer.

2. The display panel according to claim 1, further comprising a peripheral circuit comprising at least one of a scan-driving circuit and a reference signal circuit.

3. The display panel according to claim 2, wherein the scan-driving circuit comprises a plurality of scan-driving traces extending along a second direction within the display area configured to transmit scanning data for the pixel units in the display area; wherein, for pixel unit columns truncated by the groove in the second direction, the scan-driving trace corresponding to each pixel unit column, when extending linearly in the second direction from a scanning signal output terminal to the groove, resumes straight line extension after extending around an edge of the groove until reaching a position of the same pixel unit column on the other side of the groove; for pixel unit columns without being truncated by the groove in the second direction, the scan-driving trace corresponding to each pixel unit column extends linearly in the second direction.

4. The display panel according to claim 3, wherein when extending to the groove, each scan-driving trace diverges to form at least two branches, and the branches of the scan-driving trace wrap around the edge of the groove to enclose the groove.

5. The display panel according to claim 4, wherein a cross-sectional area of a portion of the scan-driving trace extending around the edge of the groove is larger than a cross-sectional area of a portion of the scan-driving trace extending linearly.

6. The display panel according to claim 3, wherein the display area includes a first region and a second region, and the second region is disposed surrounding the edge of the groove and provided with no pixel unit;

wherein, portions of the plurality of data signal wires and the plurality of power supply wires extending linearly are disposed in the first region; and portions of the common power bus, the plurality of data signal wires, the plurality of power supply wires, and the plurality of scan-driving traces extending around the edge of the groove are disposed in the second region.

7. The display panel according to claim 2, wherein the reference signal circuit comprises a plurality of reference signal traces extending along the first direction within the display area, and the plurality of reference signal traces are broken when passing through the groove.

8. The display panel according to claim 7, wherein a reference signal circuit bus of the reference signal circuit is disposed at an upper bottom portion and/or a lower bottom portion of the base substrate, and power is collectively supplied to the plurality of reference voltage traces through the reference signal circuit bus.

9. The display panel according to claim 1, wherein the display screen body is provided with at least one groove.

10. The display panel according to claim 1, wherein a distance between the first metal layer and the second metal layer is less than a distance between the second metal layer and the third metal layer, a compensating capacitance formed by the plurality of power supply wires and the plurality of scan-driving traces is greater than a compensating capacitance formed by the plurality of scan-driving traces and the plurality of data signal wires.

11. The display panel according to claim 1, wherein an area ratio of the groove to the display area is 6:10000 to 18:10000.

12. The display panel according to claim 1, wherein the base substrate is a glass substrate or a substrate of flexible material.

13. The display panel according to claim 1, wherein the groove penetrates the display surface and the back surface of the display panel to form a groove on the base substrate.

14. A display device, comprising:
a display panel according to claim 1; and
a sensing element disposed in the groove of the display panel.

15. The display device according to claim 14, further comprising a peripheral circuit comprising at least one of a scan-driving circuit and a reference signal circuit.

16. The display device according to claim 15, wherein the scan-driving circuit comprises a plurality of scan-driving traces extending along a second direction within the display area configured to transmit scanning data for the pixel units in the display area; wherein, for pixel unit columns truncated by the groove in the second direction, the scan-driving trace corresponding to each pixel unit column, when extending linearly in the second direction from a scanning signal output terminal to the groove, resumes straight line extension after extending around an edge of the groove until reaching a position of the same pixel unit column on the other side of the groove; for pixel unit columns without being truncated by the groove in the second direction, the scan-driving trace corresponding to each pixel unit column extends linearly in the second direction.

17. The display device according to claim 16, wherein when extending to the groove, each scan-driving trace diverges to form at least two branches, and the branches of the scan-driving trace wrap around the edge of the groove to enclose the groove.

18. The display device according to claim 17, wherein a cross-sectional area of a portion of the scan-driving trace extending around the edge of the groove is larger than a cross-sectional area of a portion of the scan-driving trace extending linearly.

* * * * *